(12) United States Patent
Lear

(10) Patent No.: US 10,277,198 B2
(45) Date of Patent: Apr. 30, 2019

(54) HIGH POWER AND LOW LOSS ACOUSTIC FILTER

(71) Applicant: Qorvo US, Inc., Greensboro, NC (US)

(72) Inventor: Kelly M. Lear, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 48 days.

(21) Appl. No.: 15/437,744

(22) Filed: Feb. 21, 2017

(65) Prior Publication Data

US 2017/0244382 A1 Aug. 24, 2017

Related U.S. Application Data

(60) Provisional application No. 62/297,275, filed on Feb. 19, 2016.

(51) Int. Cl.
| | |
|---|---|
| *H03H 9/46* | (2006.01) |
| *H03H 7/01* | (2006.01) |
| *H03H 9/54* | (2006.01) |
| *H03H 9/64* | (2006.01) |

(52) U.S. Cl.
CPC .......... *H03H 9/465* (2013.01); *H03H 7/0115* (2013.01); *H03H 9/542* (2013.01); *H03H 9/6483* (2013.01); *H03H 9/6409* (2013.01)

(58) Field of Classification Search
CPC ..... H03H 9/465; H03H 7/0115; H03H 9/6406
USPC ........................................................ 333/176
See application file for complete search history.

(56) References Cited

U.S. PATENT DOCUMENTS 9,762,208 B2 * 9/2017 Xu .......................... H03H 9/542

OTHER PUBLICATIONS

Tirado, "Bulk Acoustic Wave Resonators and their Application to Microwave Devices", Ph.D. Dessertation, 2010, pp. 6.*
Galipeau, J. et al., "Design Considerations for High Power BAW Duplexers for Base Station Applications," 2015 IEEE International Ultrasonics Symposium Proceedings, Oct. 21-24, 2015, Taipei, Taiwan, IEEE, 4 pages.

* cited by examiner

*Primary Examiner* — Benny T Lee
*Assistant Examiner* — Hafizur Rahman
(74) *Attorney, Agent, or Firm* — Withrow & Terranova, P.L.L.C.

(57) ABSTRACT

The present disclosure relates to a high power and low loss acoustic filter that includes a first node, a second node, a first power bypass path, and a first acoustic resonator (AR) path. The first power bypass path extends between the first node and the second node. The first AR path also extends between the first node and the second node, is in parallel with the first power bypass path, and includes at least one first acoustic resonator that form an acoustic resonator network. Herein, the first AR path has a notch filter response. The first power bypass path and the first AR path form a first filter cell that has a band-pass filter response.

24 Claims, 15 Drawing Sheets

HIGH POWER AND LOW LOSS ACOUSTIC FILTER

RELATED APPLICATIONS

Figure 1:
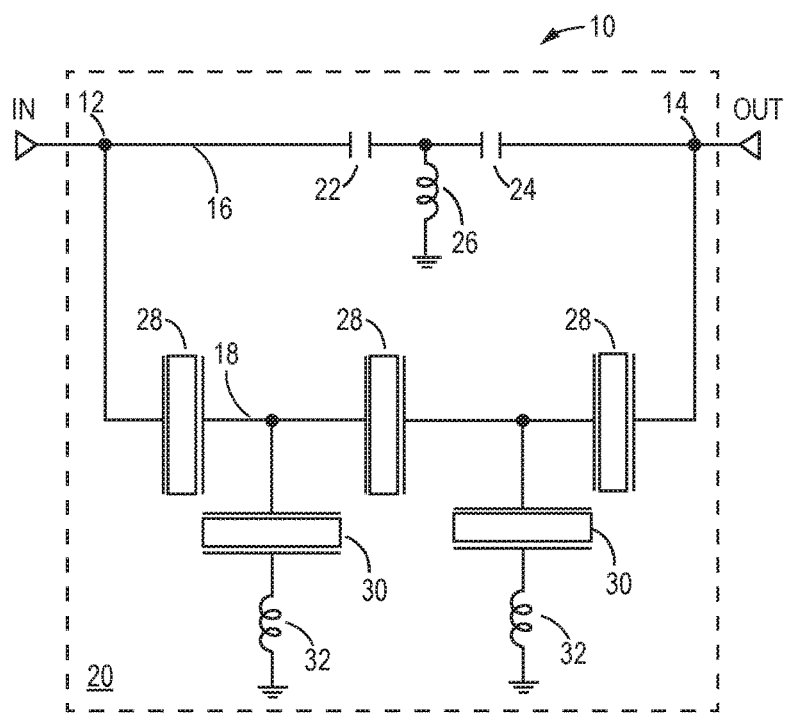

This application claims the benefit of provisional patent application Ser. No. 62/297,275, filed Feb. 19, 2016, the disclosure of which is hereby incorporated herein by reference in its entirety.

FIELD OF THE DISCLOSURE

The present disclosure relates to an acoustic filter, and more particularly to a high power and low loss acoustic filter that includes at least one power bypass path in parallel with at least one high Q factor acoustic resonator (AR) path.

BACKGROUND

The wide utilization of communication devices drives the rapid development of radio frequency (RF) filters. These RF-filters are needed to protect the receive (Rx) path/transmit (Tx) path from noise and interference from different RF channels and sources. For cellular phone applications, the Rx/Tx bandwidth is relatively narrow, typically no more than 194 MHz, and the Rx band is only 190 MHz apart from the Tx band. Therefore, highly selective RF filters are required to make sure only signals from the correct Rx/Tx band are used.

In order to achieve steep filtering, surface acoustic wave (SAW) filters, bulk-acoustic-wave (BAW) filters, thin-film bulk acoustic resonator (FBAR) filters, and microelectromechanical system (MEMs) filters have been introduced because of their quality (Q) factor advantages. However, these high-Q filters normally do not have high power handling, such that only a small amount of power can flow through these high-Q filters, which is undesirable for high power communication devices.

Accordingly, there remains a need for improved filter designs to provide high Q factors without being limited to low power handling. In addition, it is also desirable that the improved filter designs have the flexibility to be used in applications in different frequency ranges.

SUMMARY

The present disclosure relates to a high power and low loss acoustic filter that includes a first node, a second node, a first power bypass path, and a first acoustic resonator (AR) path. The first power bypass path extends between the first node and the second node. The first AR path also extends between the first node and the second node, is in parallel with the first power bypass path, and includes at least one first acoustic resonator that forms a first acoustic resonator network. Herein, the first AR path has a notch filter response. The first power bypass path and the first AR path form a first filter cell that has a band-pass filter response.

In one embodiment of the acoustic filter, the first power bypass path is a transmission line path including at least one transmission line. Herein, the first power bypass path has a loss no more than 1 dB and the first AR path has a Q factor no less than 500.

In one embodiment of the acoustic filter, the first power bypass path is an inductor-capacitor (L-C) path that has a filter response and comprises series and shunt lumped elements. Herein, the first power bypass path has a loss no more than 1 dB and the first AR path has a Q factor no less than 500.

In one embodiment of the acoustic filter, the first AR path has a Q factor between 1000 and 3000, the first power bypass path has a loss between 0.15 dB and 0.5 dB, and the first filter cell formed by the first power bypass path and the first AR path has a passband with a center frequency between 200 MHz and 3 GHz.

In one embodiment of the acoustic filter, the first AR path has a Q factor greater than 10000, the first power bypass path has a loss between 0.1 dB and 0.25 dB, and the first filter cell formed by the first power bypass path and the first AR path has a passband with a center frequency between 1 MHz and 300 MHz.

According to another embodiment, the acoustic filter further includes a third node, a fourth node, a second power bypass path, and a second AR path. The second power bypass path extends between the third node and the fourth node. The second AR path extends between the third node and the fourth node, is in parallel with the second power bypass path, and includes at least one second acoustic resonator that forms a second acoustic resonator network. Herein, the third node is coupled to the second node and the first power bypass path is in series with the second power bypass path. The second AR path has a notch filter response. The second power bypass path and the second AR path form a second filter cell that has a band-pass filter response. The second filter cell is cascaded with the first filter cell.

In one embodiment of the acoustic filter, the first power bypass path has a loss no more than 1 dB, the second power bypass path has a loss no more than 1 dB, the first AR path has a Q factor no less than 500, and the second AR path has a Q factor no less than 500.

In one embodiment of the acoustic filter, an input signal applied to the second node provides a first output signal at the first node and a second output signal at the fourth node.

In one embodiment of the acoustic filter, the first power bypass path is a first L-C path that has a first filter response and comprises first series and shunt lumped elements and the second power bypass path is a second L-C path that has a second filter response and comprises second series and shunt lumped elements.

In one embodiment of the acoustic filter, the first power bypass path is an L-C path that has a filter response and comprises series and shunt lumped elements and the second power bypass path is a transmission line path including at least one transmission line.

According to another embodiment, the acoustic filter further includes a third power bypass path. Herein, the third power bypass path extends between the first node and the fourth node, and is in parallel with the first power bypass path and the second power bypass path. The third power bypass path has a loss no more than 1 dB.

According to another embodiment, the acoustic filter further includes a second AR path that has a notch filter response. This second AR path extends between the first node and the second node, and is in parallel with the first power bypass path.

In one embodiment of the acoustic filter, the first AR path and the second AR path are symmetrical.

In one embodiment of the acoustic filter, the first AR path and the second AR path are asymmetrical.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS FIGURES

The accompanying drawing figures incorporated in and forming a part of this specification illustrate several aspects of the disclosure, and together with the description serve to explain the principles of the disclosure.

FIG. 1 provides an exemplary acoustic filter according to one embodiment of the present disclosure.

Figure 2:
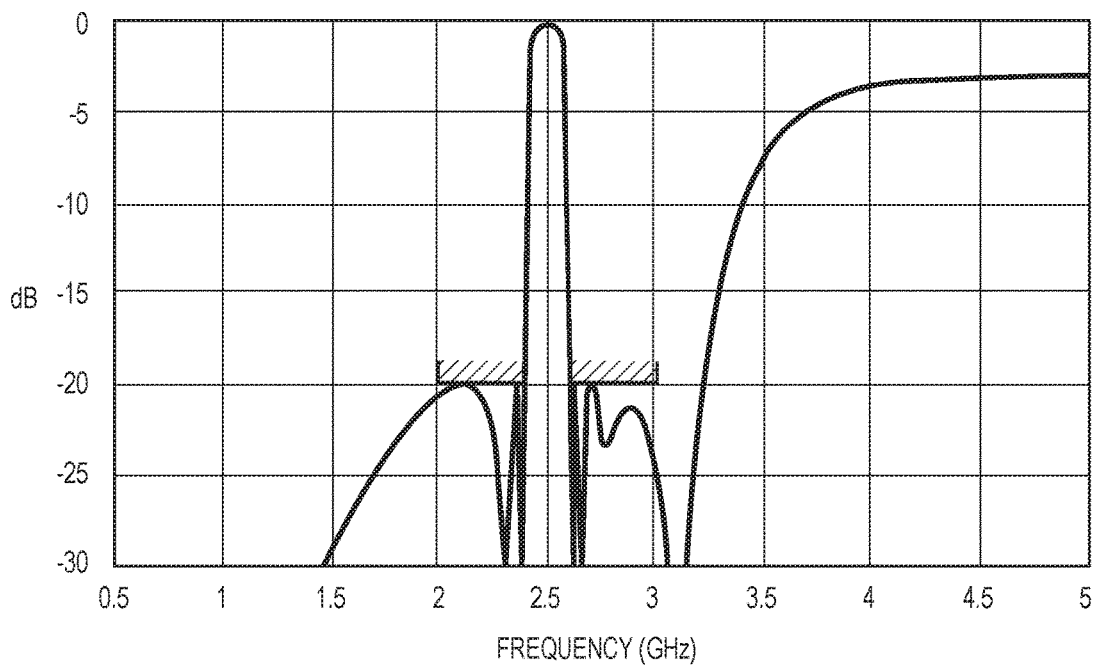

FIG. 2 provides a frequency response of the exemplary acoustic filter shown in FIG. 1.

Figure 3:
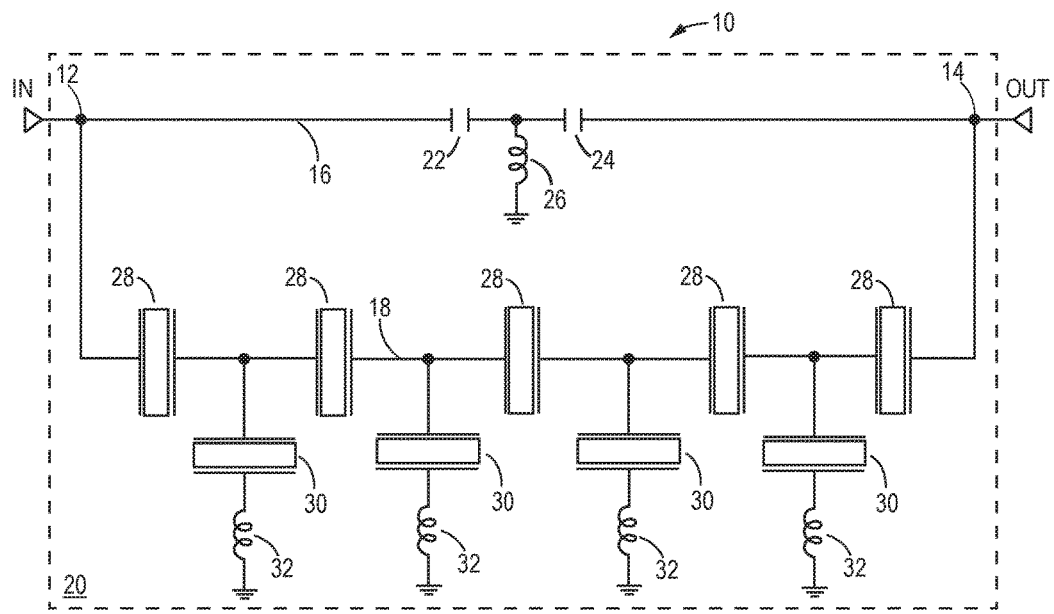

FIG. 3 provides an exemplary acoustic filter according to one embodiment of the present disclosure.

Figure 4:
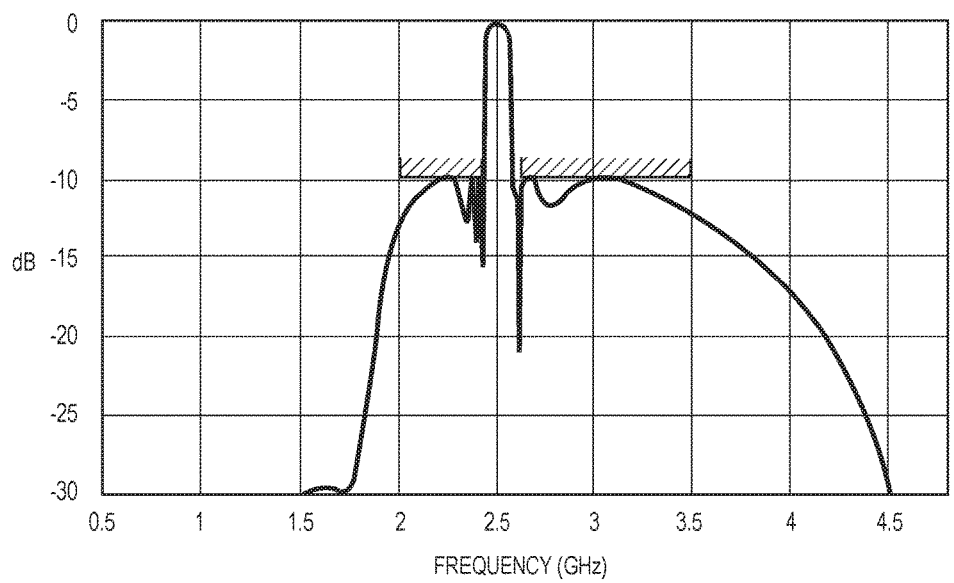

FIG. 4 provides a frequency response of the exemplary acoustic filter shown in FIG. 3.

Figure 5:
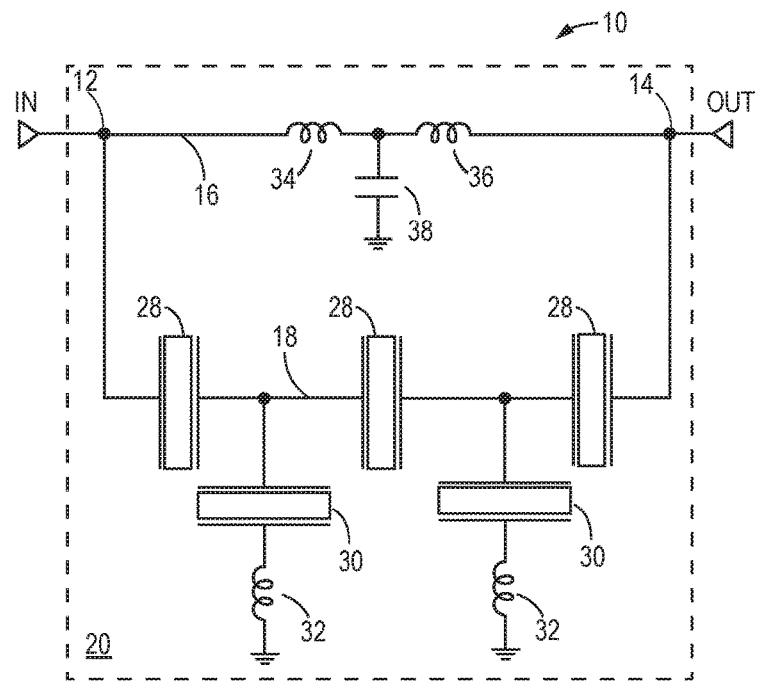

FIG. 5 provides an exemplary acoustic filter according to one embodiment of the present disclosure.

Figure 6:
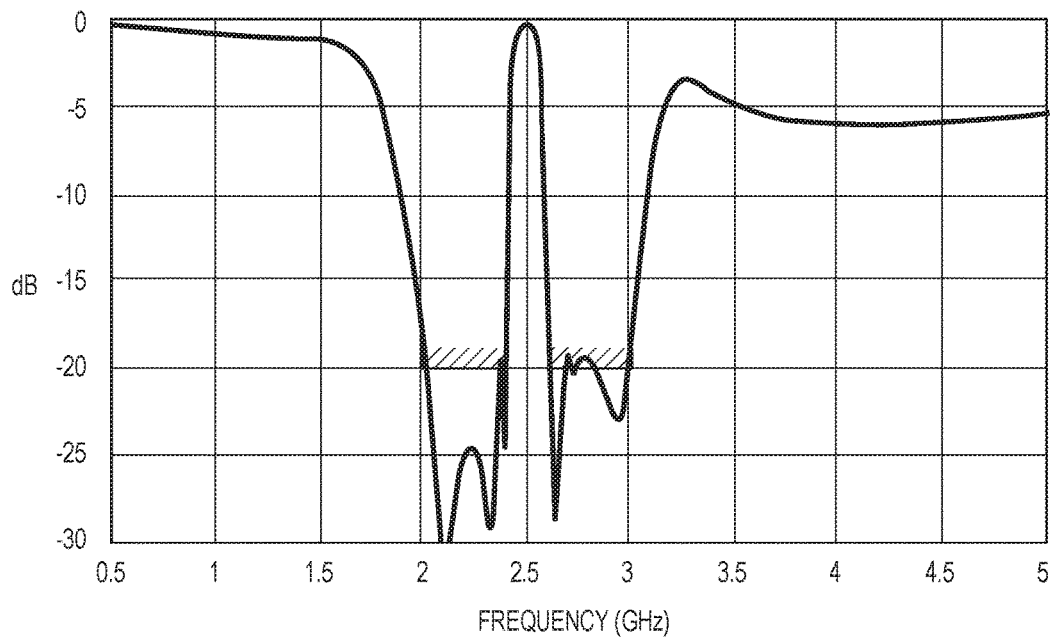

FIG. 6 provides a frequency response of the exemplary acoustic filter shown in FIG. 5.

Figure 7:
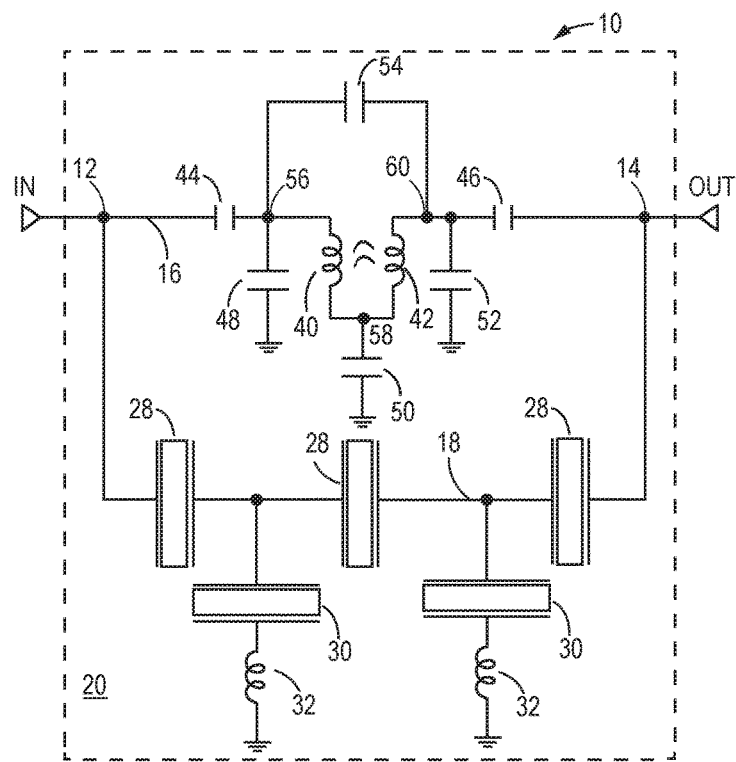

FIG. 7 provides an exemplary acoustic filter according to one embodiment of the present disclosure.

Figure 8:
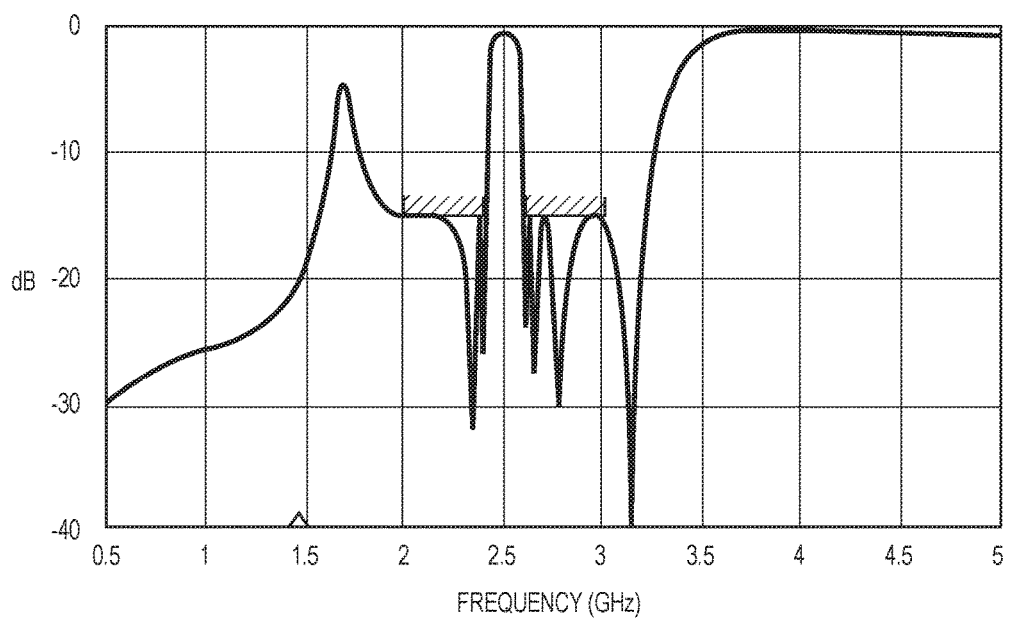

FIG. 8 provides a frequency response of the exemplary acoustic filter shown in FIG. 7.

Figure 9:
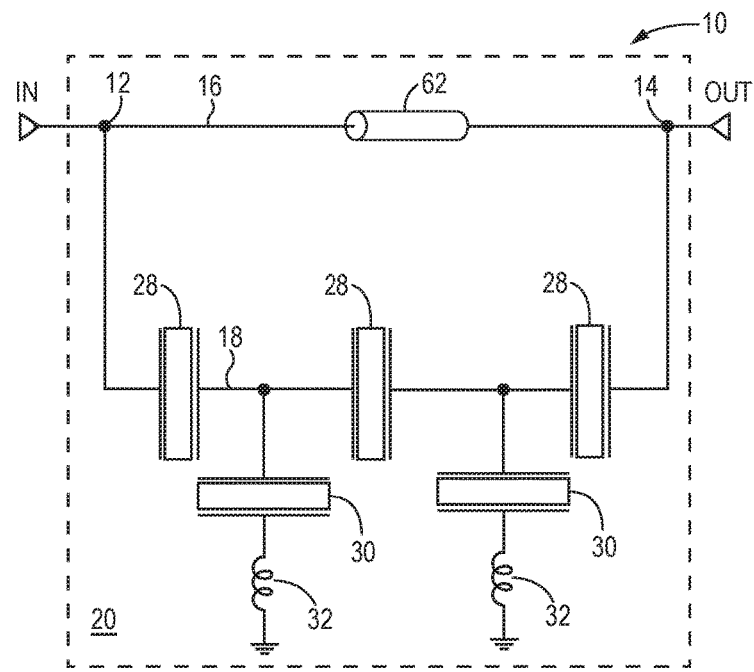

FIG. 9 provides an exemplary acoustic filter according to one embodiment of the present disclosure.

Figure 10:
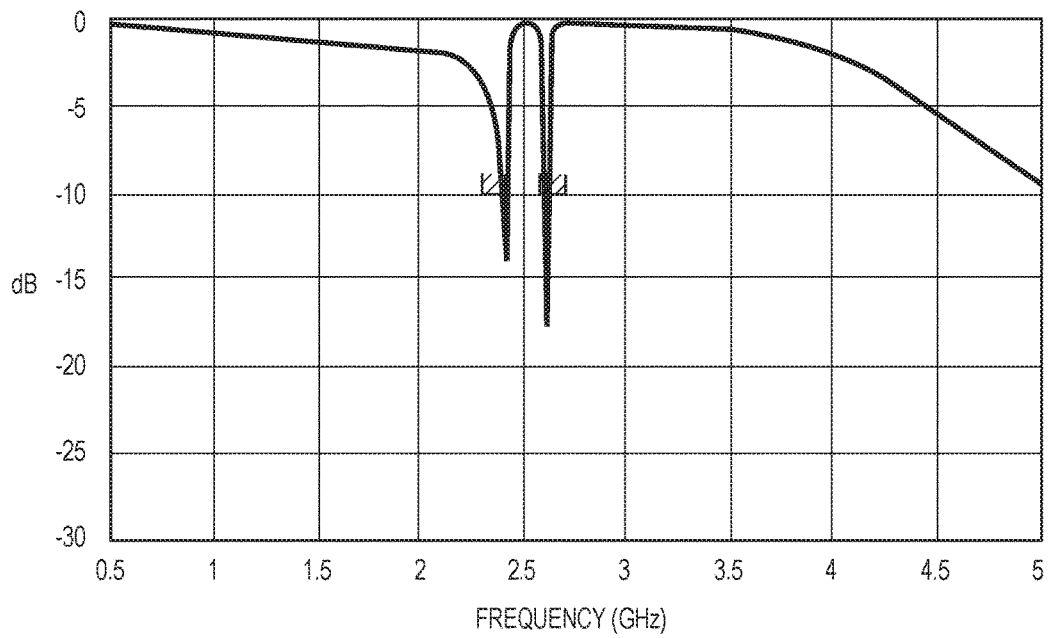

FIG. 10 provides a frequency response of the exemplary acoustic filter shown in FIG. 9.

Figure 11:
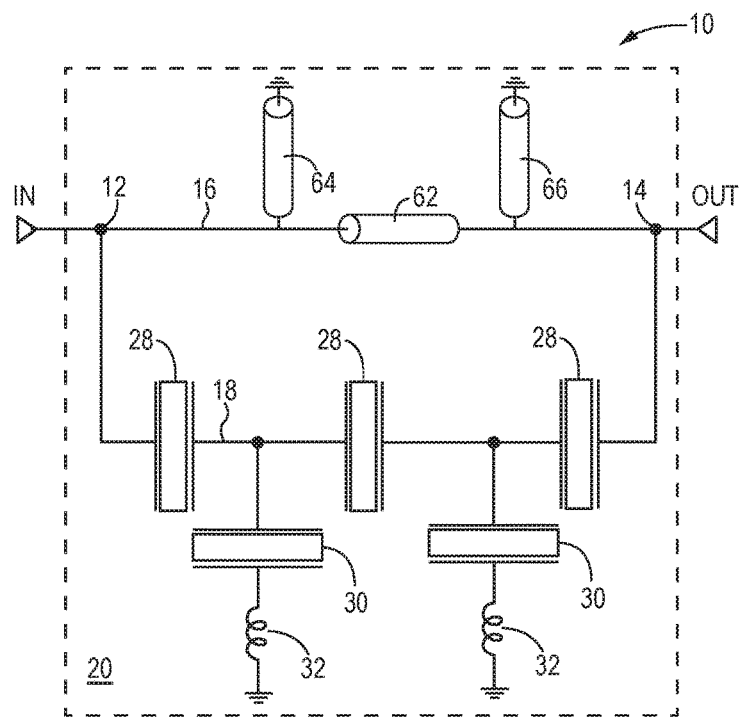

FIG. 11 provides an exemplary acoustic filter according to one embodiment of the present disclosure.

Figure 12:
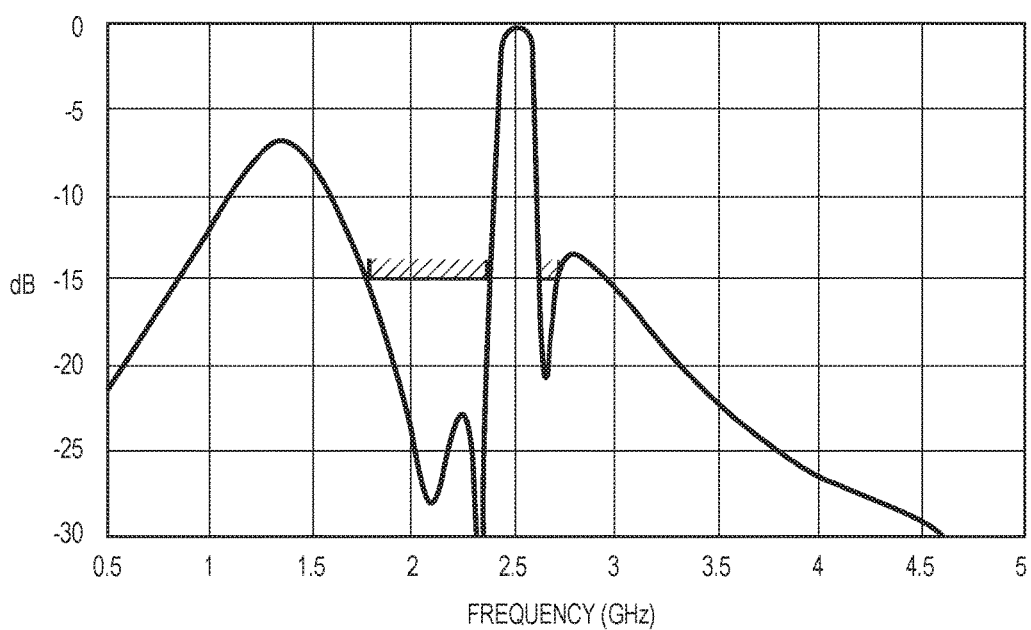

FIG. 12 provides a frequency response of the exemplary acoustic filter shown in FIG. 11.

Figure 13:
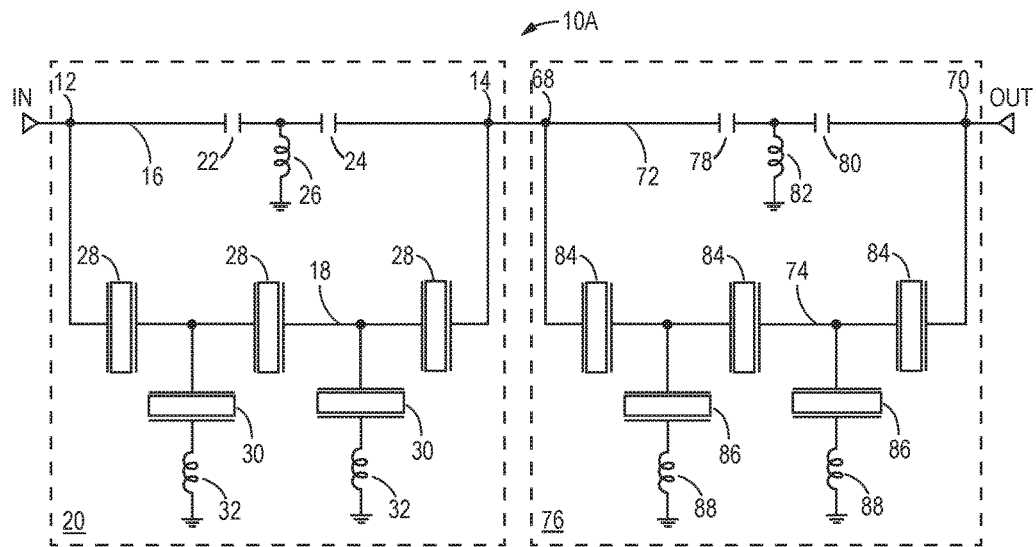

FIG. 13 provides an exemplary acoustic filter with a cascade structure according to one embodiment of the present disclosure.

Figure 14:
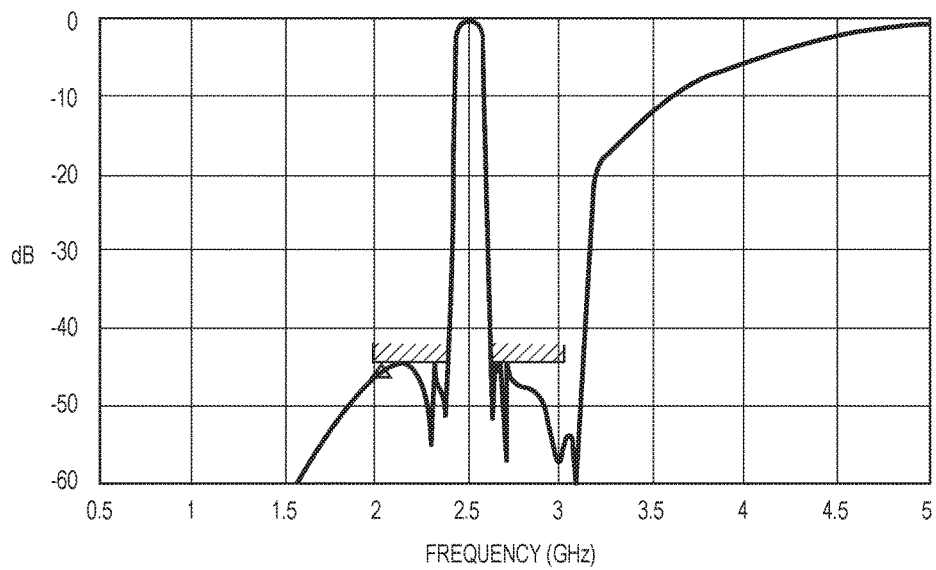

FIG. 14 provides a frequency response of the exemplary acoustic filter shown in FIG. 13.

Figure 15:
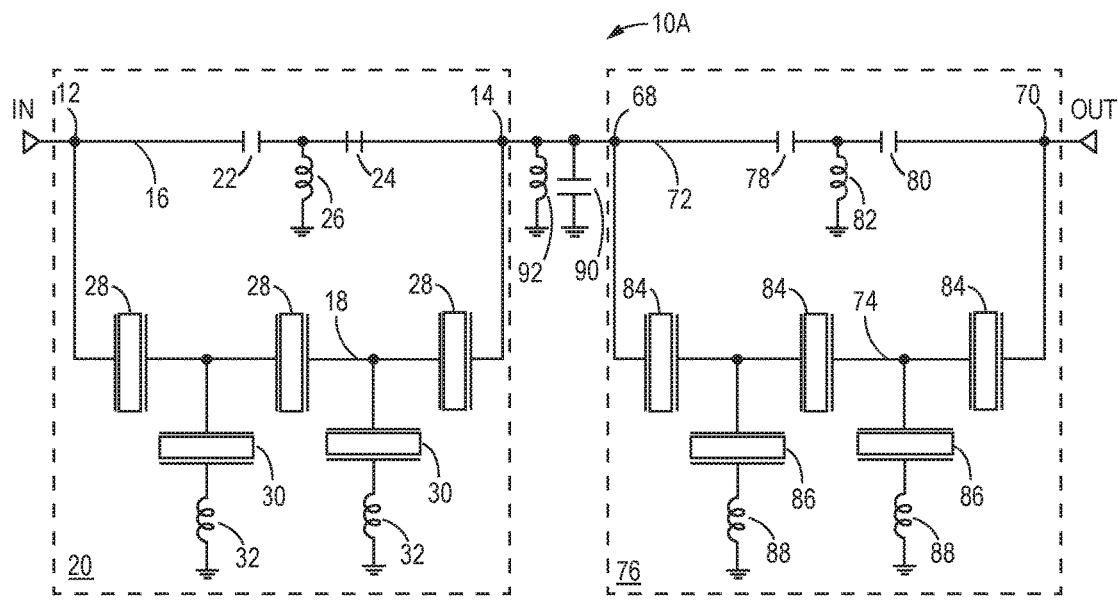

FIG. 15 provides an exemplary acoustic filter with a cascade structure according to one embodiment of the present disclosure.

Figure 16:
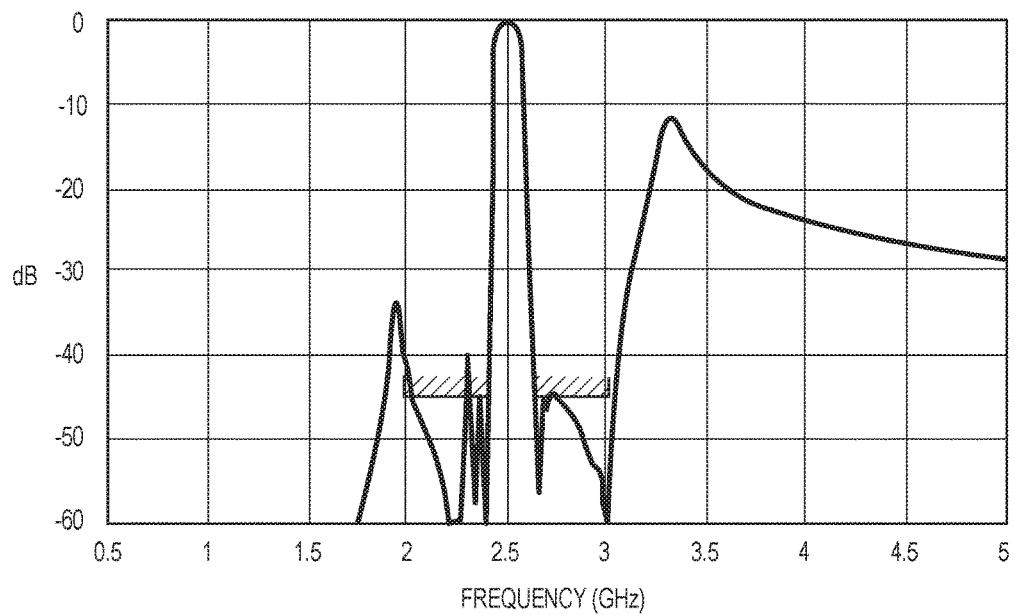

FIG. 16 provides a frequency response of the exemplary acoustic filter shown in FIG. 15.

Figure 17:
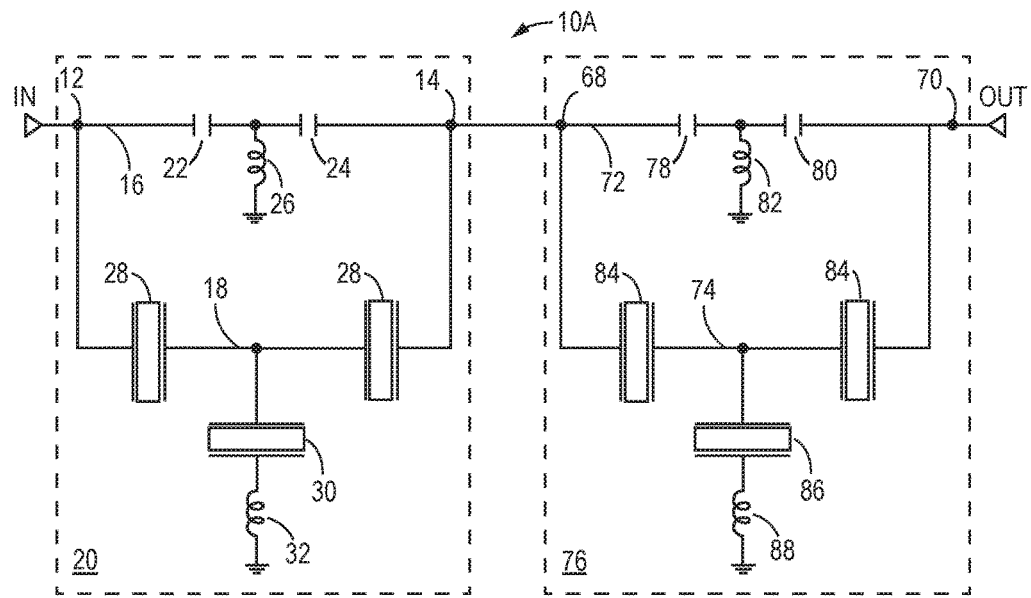

FIG. 17 provides an exemplary acoustic filter with a cascade structure according to one embodiment of the present disclosure.

Figure 18:
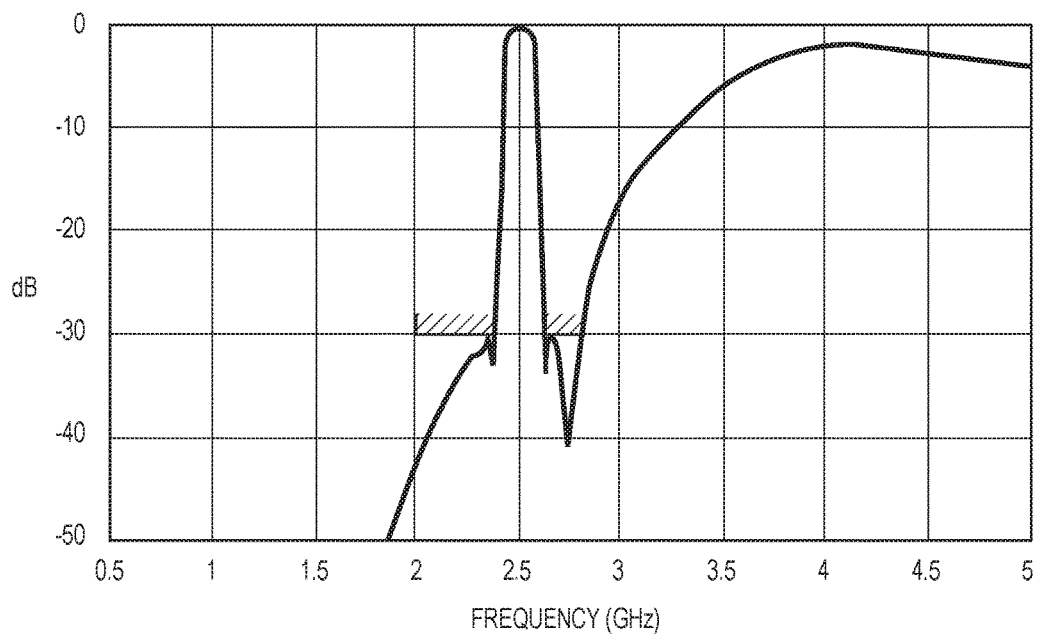

FIG. 18 provides a frequency response of the exemplary acoustic filter shown in FIG. 17.

Figure 19:
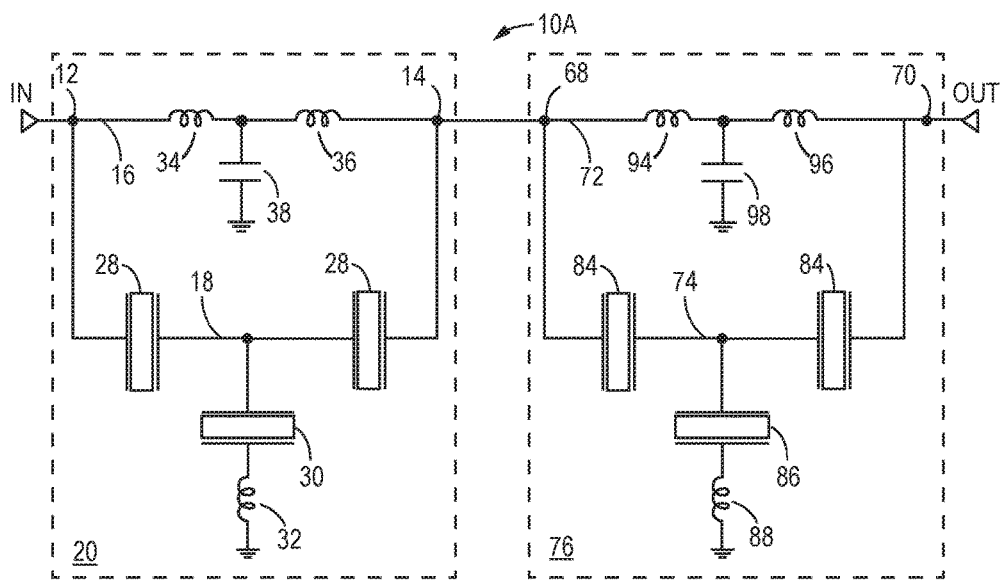

FIG. 19 provides an exemplary acoustic filter with a cascade structure according to one embodiment of the present disclosure.

Figure 20:
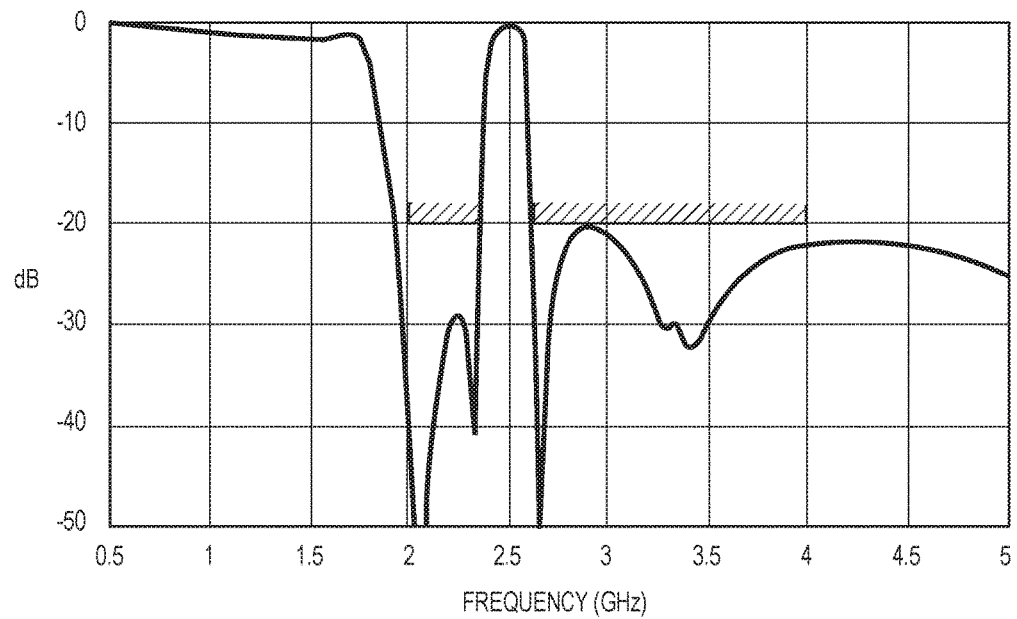

FIG. 20 provides a frequency response of the exemplary acoustic filter shown in FIG. 19.

Figure 21:
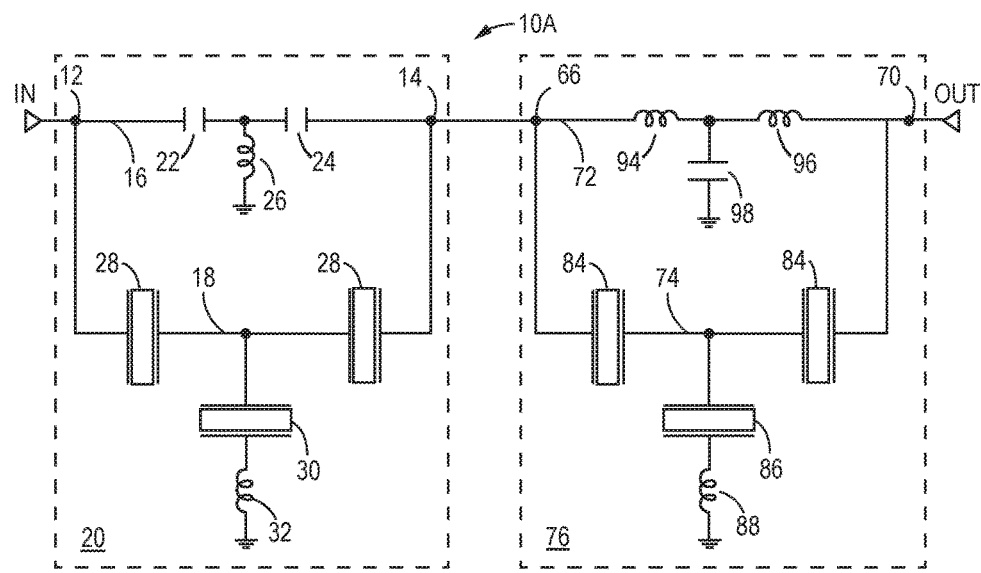

FIG. 21 provides an exemplary acoustic filter with a cascade structure according to one embodiment of the present disclosure.

Figure 22:
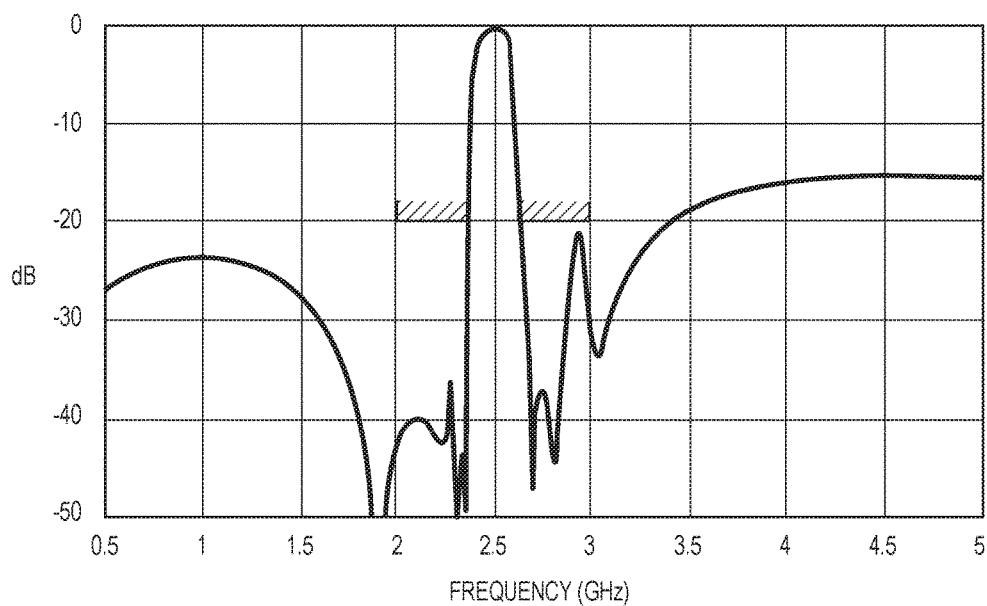

FIG. 22 provides a frequency response of the exemplary acoustic filter shown in FIG. 21.

Figure 23:
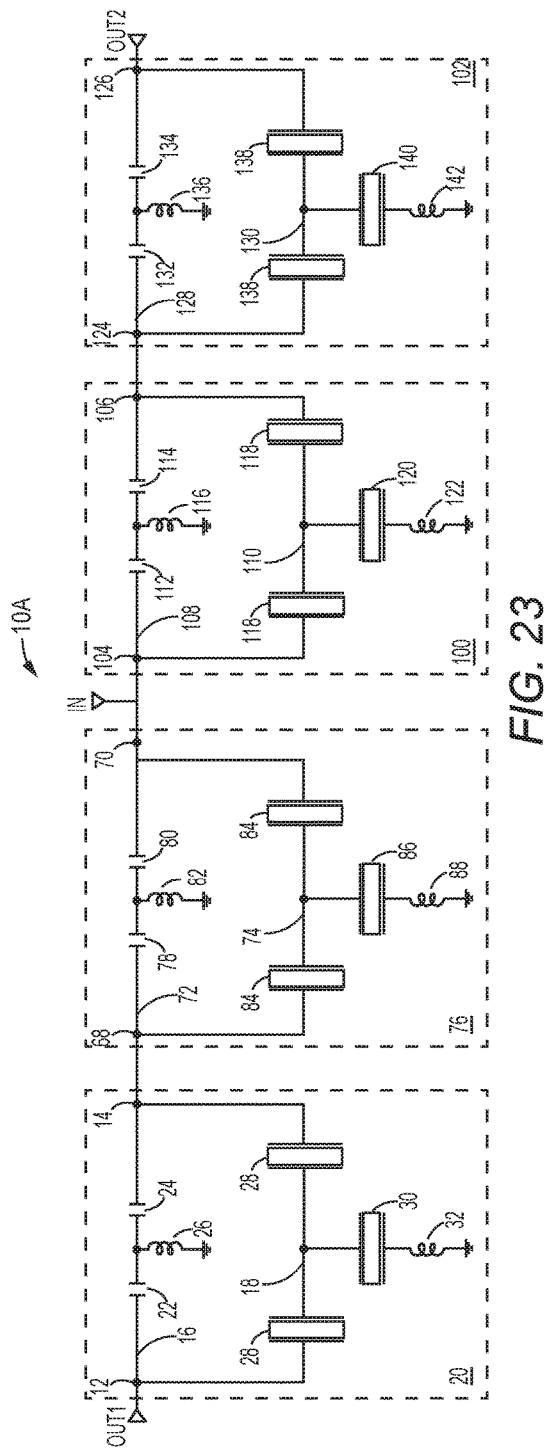

FIG. 23 provides an exemplary acoustic filter with a cascade structure according to one embodiment of the present disclosure.

Figure 24:
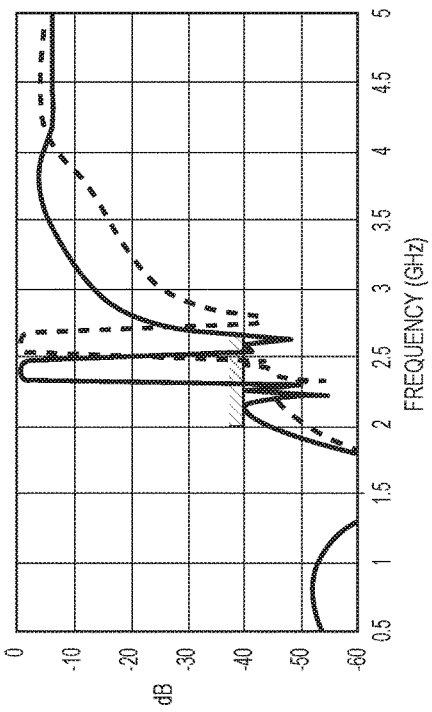

FIG. 24 provides a frequency response of the exemplary acoustic filter shown in FIG. 23.

Figure 25:
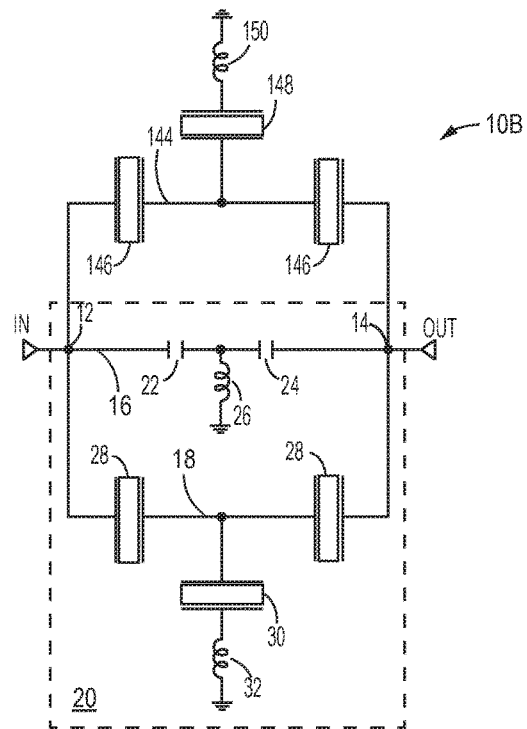

FIG. 25 provides an exemplary acoustic filter with in parallel acoustic resonator paths according to one embodiment of the present disclosure.

Figure 26:
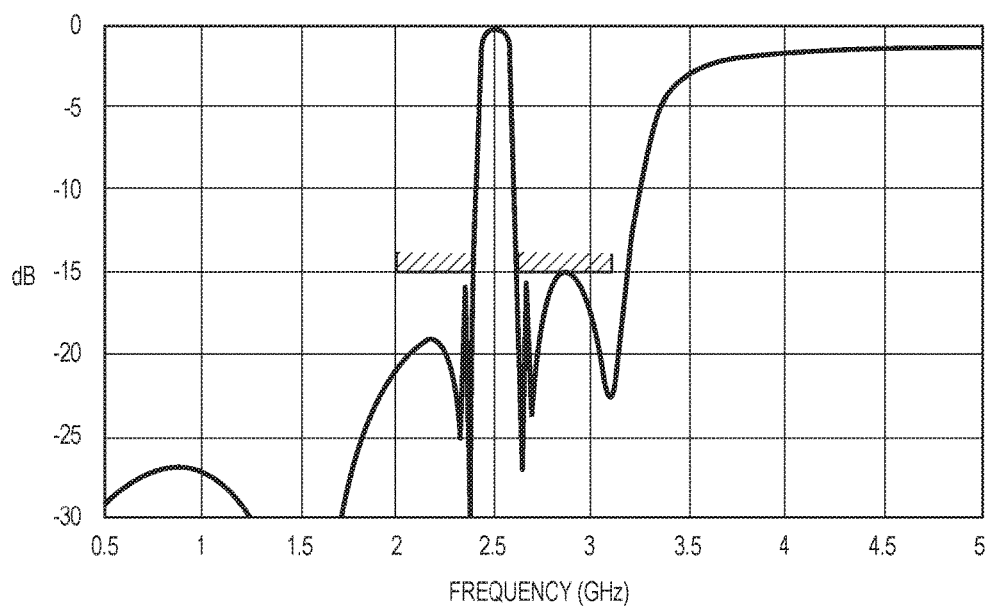

FIG. 26 provides a frequency response of the exemplary acoustic filter shown in FIG. 25.

Figure 27:
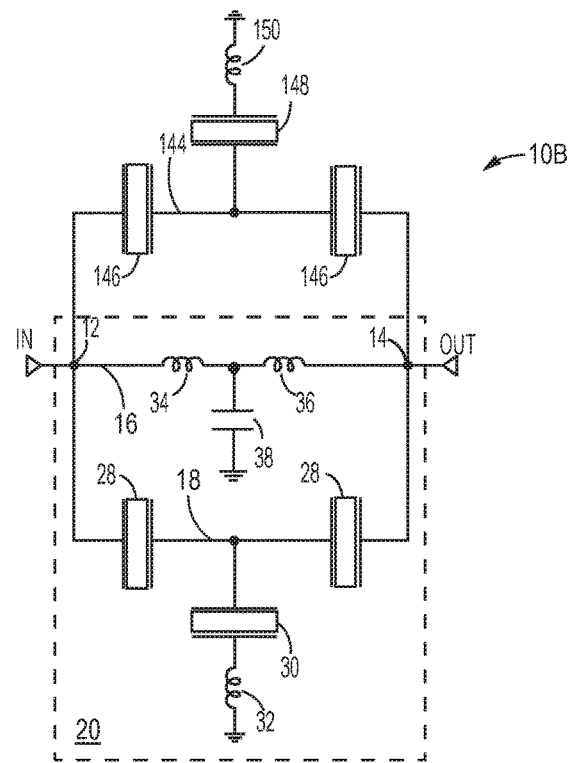

FIG. 27 provides an exemplary acoustic filter with in parallel acoustic resonator paths according to one embodiment of the present disclosure.

Figure 28:
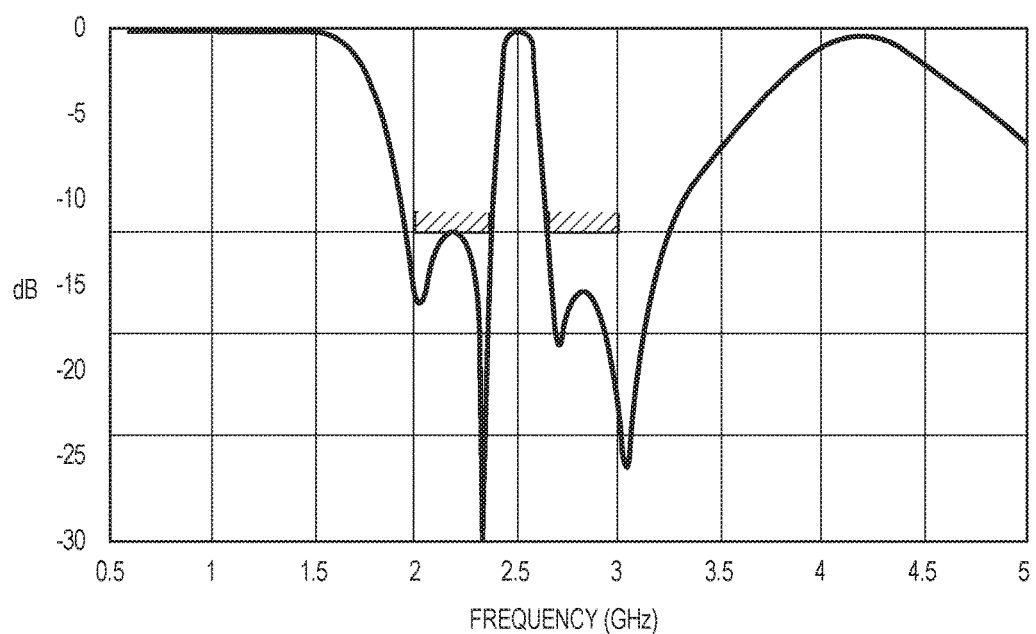

FIG. 28 provides a frequency response of the exemplary acoustic filter shown in FIG. 27.

Figure 29:
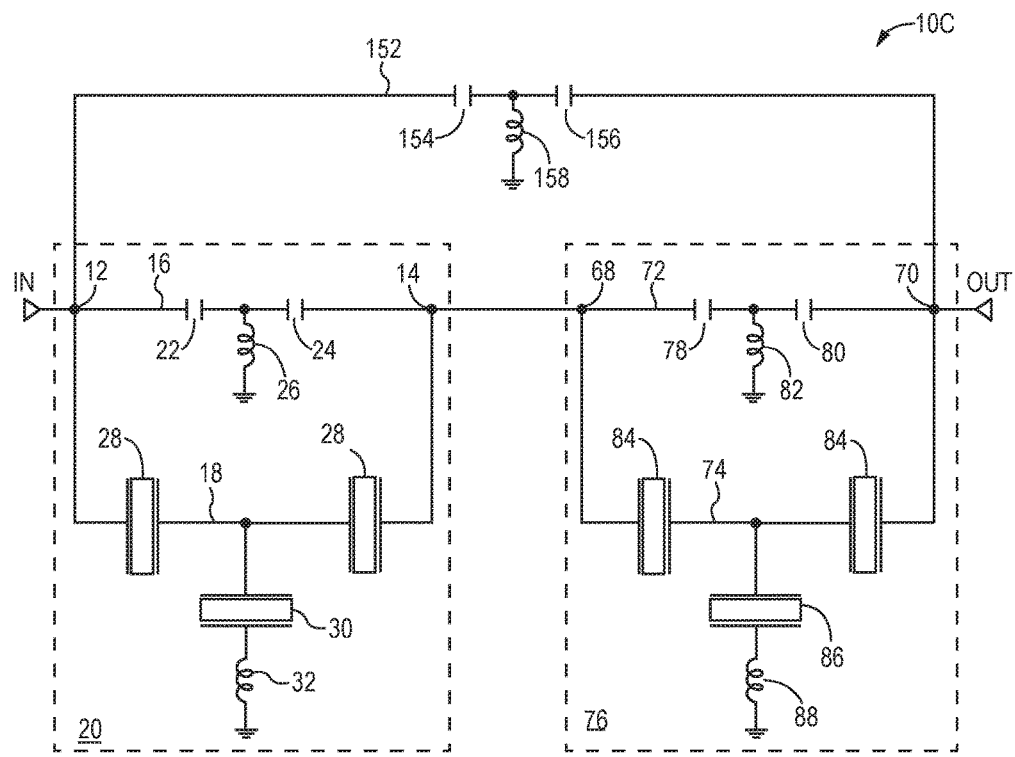

FIG. 29 provides an exemplary acoustic filter with a nested structure according to one embodiment of the present disclosure.

Figure 30:
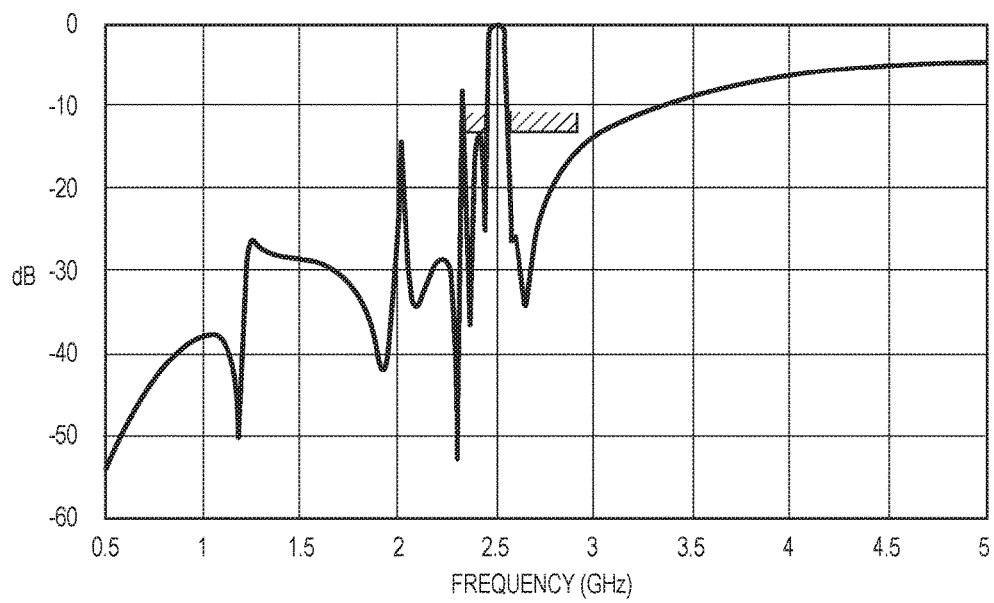

FIG. 30 provides a frequency response of the exemplary acoustic filter shown in FIG. 29.

It will be understood that for clear illustrations, FIGS. 1-30 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms "first," "second," etc. may be used herein to describe various elements, these elements should not be limited by these terms. These terms are only used to distinguish one element from another. For example, "a first element" could be termed "a second element," and, similarly, "a second element" could be termed, "a first element," without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a high power and low loss acoustic filter that includes at least one high power handling power bypass path in parallel with at least one high Q factor acoustic resonator (AR) path. FIG. 1 provides an exemplary acoustic filter 10 including a first node 12, a second node 14, a first power bypass path 16, and a first AR path 18. The first power bypass path 16 extends between the first node 12 and the second node 14. The first AR path 18 is in parallel with the first power bypass path 16 and extends between the first node 12 and the second node 14. An input signal IN applied to the first node 12 provides an output signal OUT at the second node 14.

In certain embodiments, the first power bypass path 16 is a high power handling path with a loss no more than 1.0 dB, and the first AR path 18 has a high Q factor no less than 500. The first power bypass path does not need to have a high Q factor in these embodiments, and for example, may have a Q factor as low as 2. The first AR path 18 is a path with high reflectivity in the passband of interest, which highly reflects power instead of passing or dissipating power in the passband of interest. Being highly reflective means at least 80% of the power does not go through the first AR path 18, it is reflected back to its origin. The first AR path 18 does not have a loss requirement and may have a loss as high as 90 dB.

The first power bypass path 16 may be a transmission line path that includes at least one transmission line formed from a coax, a microstrip, coplanar waveguide, substrate integrated waveguide, or the like. In addition, the first power bypass path 16 may be an inductor-capacitor (L-C) path that includes lumped elements and may have a low-pass filter response, a high-pass filter response, or a band-pass filter response. The first AR path 18 includes at least one acoustic resonator to form an acoustic resonator network that has a notch filter response. The first power bypass path 16 and the first AR path 18 form a first filter cell 20 that has a steep band-pass filter response over the range of interest. A steep band-pass filter response refers to a band-pass response having at least 40 dB/octave roll-offs.

For the purpose of this illustration, the first power bypass path 16 is an L-C path including a first series capacitor 22, a second series capacitor 24, and a first shunt inductor 26 coupled to form a T-type (series, shunt, series) capacitor-inductor-capacitor (CLC) structure that has a high-pass filter response. The first series capacitor 22, the second series capacitor 24, and the first shunt inductor 26 may vary in values to achieve different impedance of the first power bypass path 16. Herein, the first series capacitor 22 is in series with the second series capacitor 24. The first series capacitor 22 and the second series capacitor 24 are coupled between the first node 12 and the second node 14. The first shunt inductor 26 is coupled between ground and a joint node of the first series capacitor 22 and the second series capacitor 24.

The first AR path 18 includes three first series resonators 28 and two first shunt resonators 30 coupled to form a ladder network. Herein, a ladder network refers to a network that has at least two series resonators and at least one shunt resonator. The first series resonators 28 are in series and coupled between the first node 12 and the second node 14. Each first shunt resonator 30 is coupled between ground and a joint node of adjacent two first series resonators 28, respectively. In order to create a separate anti-resonance, the first AR path 18 may further include two first anti-resonant inductors 32. Each first anti-resonant inductor 32 is coupled between ground and a corresponding first shunt resonator 30. Herein, the first series resonators 28 and the first shunt resonators 30 may be bulk acoustic wave (BAW) resonators, surface acoustic wave (SAW) resonators, quartz crystal resonators, langatate crystal resonators, microelectromechanical system (MEMs) resonators, thin-film bulk acoustic resonators (FBARs), Microresonators, or wine glass mode resonators.

FIG. 2 provides a frequency response of the acoustic filter 10 shown in FIG. 1. In this embodiment, the acoustic filter 10 has a steep passband between 2.375 GHz and 2.625 GHz with a center frequency at 2.5 GHz. Herein, the passband (2.37~2.625 GHz) loss of the acoustic filter 10 is about 0.3 dB. The shaded regions represent a desired signal depression level for frequencies other than the passband. For adjacent stopband ranges (<2.375 GHz and 2.62~3.125 GHz), a signal depression is at least 20 dB. The signal depression for frequencies higher than 3.125 GHz may be improved by cascading the acoustic filter 10 with a low-pass filter, which does not have a steepness requirement.

Utilizing different resonators in the first AR path 18, the steep passband of the acoustic filter 10 may shift to higher or lower frequency ranges. The center frequency of the passband may vary from 1 MHz to 10 GHz. For applications with a center frequency between 200 MHz and 3 GHz, SAW or BAW resonators with a Q factor between 1000 and 3000 may be used in the first AR path 18 and an L-C structure with a loss between 0.15 dB and 0.5 dB may be formed in the first power bypass path 16. For applications with a center frequency between 1 MHz and 300 MHz, quartz crystal resonators with a Q factor greater than 10000 may be used in the first AR path 18 and an L-C structure with a loss between 0.1 dB and 0.25 dB may be formed in the first power bypass path 16. In other applications, the first power bypass path 16 may have a loss less than ⅓ dB or ½ dB, while the first AR path 18 has a Q factor greater than 500, 750, or 1000.

In different applications, the first AR path 18 may include fewer or more acoustic resonators. In order to improve an overall band-pass filter response, the first AR path 18 may include more first series resonators 28 and more first shunt resonators 30. As shown in FIG. 3, the first AR path 18 includes five first series resonators 28 and four first shunt resonators 30 coupled to form a ladder network. The first series resonators 28 are in series and coupled between the first node 12 and the second node 14. Each first shunt resonator 30 is coupled between ground and a joint node of adjacent two first series resonators 28, respectively. Further, the first AR path 18 may include more first anti-resonant inductors 32 corresponding to the increment of the first shunt resonators 30. Herein, the first AR path 18 includes four first anti-resonant inductors 32. Each first anti-resonant inductor 32 is coupled between ground and a corresponding first shunt resonator 30.

FIG. 4 provides a frequency response of the acoustic filter 10 shown in FIG. 3. In this embodiment, the acoustic filter 10 has a steep passband between 2.375 GHz and 2.625 GHz with a center frequency at 2.5 GHz. The passband (2.37~2.625 GHz) loss of the acoustic filter 10 is about 0.3 dB. For stopband ranges outside the passband, the signal depression is at least 10 dB. The first AR path 18 with more series/shunt resonators trades off less signal depression in adjacent stopband ranges for better overall signal depression.

It is clear to anyone skilled in the art that the first power bypass path 16 may be an L-C path having a low-pass filter response. As shown in FIG. 5, the first power bypass path 16 includes a first series inductor 34, a second series inductor 36, and a first shunt capacitor 38 coupled to form a T-type inductor-capacitor-inductor (LCL) structure that has a low-pass filter response. The first series inductor 34, the second series inductor 36, and the first shunt capacitor 38 may vary in values to achieve different impedance of the first power bypass path 16. The first series inductor 34 is in series with the second series inductor 36. The first series inductor 34 and the second series inductor 36 are coupled between the first node 12 and the second node 14. The first shunt capacitor 38 is coupled between ground and a joint node of the first series inductor 34 and the second series inductor 36. Herein, the first filter cell 20 still has a band-pass filter response over the range of interest.

FIG. 6 provides a frequency response of the acoustic filter 10 shown in FIG. 5. The acoustic filter 10 has a steep passband between 2.375 GHz and 2.625 GHz with a center frequency at 2.5 GHz. The passband (2.37~2.625 GHz) loss of the acoustic filter 10 is about 0.3 dB. For adjacent stopband ranges (2~2.375 GHz and 2.62~3 GHz), the signal depression is at least 18 dB. The signal depression for frequencies higher than 3.125 GHz may be improved by cascading the acoustic filter 10 with a band-pass filter, which does not have a steepness requirement.

Beside the T-type CLC structure and the T-type LCL structure, the first power bypass path 16 may include Pi-type (shunt, series, shunt) CLC structure, Pi-type LCL structure, L-type (series, shunt or shunt, series) structure, or other L-C structures. As shown in FIG. 7, the first power bypass path 16 is an L-C path including a first coupled inductor 40, a second coupled inductor 42, a third series capacitor 44, a fourth series capacitor 46, a second shunt capacitor 48, a third shunt capacitor 50, a fourth shunt capacitor 52, and a parallel capacitor 54 coupled to form an L-C nested structure that has a band-pass filter response.

The first coupled inductor 40 and the second coupled inductor 42 are close to each other such that a magnetic field from one influences the other. In addition, the first coupled inductor 40 is in series with the second coupled inductor 42. The third series capacitor 44 is coupled between the first node 12 and the first coupled inductor 40. The fourth series capacitor 46 is coupled between the second coupled inductor 42 and the second node 14. The second shunt capacitor 48 is coupled between ground and a first joint node 56 of the third series capacitor 44 and the first coupled inductor 40. The third shunt capacitor 50 is coupled between ground and a second joint node 58 of the first coupled inductor 40 and the second coupled inductor 42. The fourth shunt capacitor 52 is coupled between ground and a third joint node 60 of the second coupled inductor 42 and the fourth series capacitor 46. The parallel capacitor 54 is in parallel with the first coupled inductor 40 and the second coupled inductor 42, and coupled between the first joint node 56 and the third joint node 60. Herein, the first filter cell 20 still has a band-pass filter response over the range of interest.

FIG. 8 provides a frequency response of the acoustic filter 10 shown in FIG. 7. The acoustic filter 10 has a steep passband between 2.375 GHz and 2.625 GHz with a center frequency at 2.5 GHz. The passband (2.375~2.625 GHz) loss of the acoustic filter 10 is about 0.3 dB. For adjacent stopband ranges (2~2.375 GHz and 2.625~3.125 GHz), the signal depression is at least 15 dB. Normally, one may balance between the signal depression in adjacent stopbands and the overall signal depression. Better signal depression in adjacent stopbands results in worse overall signal depression. The signal depression for frequencies higher than 3.125 GHz and lower than 2 GHz may be improved by cascading the acoustic filter 10 with a band-pass filter, which does not have a steepness requirement.

Notice that no matter the first power bypass path 16 has a low-pass filter response, a high-pass filter response, or a band-pass filter response, the first power bypass path 16 is always a high power handling path with a small loss no more than 1.0 dB. In addition, no matter how many and which acoustic resonators are included in the first AR path 18, the first AR path 18 always has a high Q factor no less than 500. The acoustic filter 10 has a steep and low-loss passband around a center frequency. Normally, one may balance between the signal depression in adjacent stopbands and the overall signal depression.

For applications with a high frequency range greater than 2.5 GHz, a transmission line instead of an L-C structure may be more practical for the first power bypass path 16, and the first AR path 18 may have a Q factor as low as 500. Further, for high power/low loss applications (radio or TV station transmitters), even with a frequency range lower than 1 GHz, a transmission line may also be desired for the first power bypass path 16 because of its superior power handling. As shown in FIG. 9, the first power bypass path 16 includes a first transmission line 62, which may not have a filter response. The first transmission line 62 is coupled between the first node 12 and the second node 14, and in parallel with the first AR path 18.

FIG. 10 provides a frequency response of the acoustic filter 10 shown in FIG. 9. The acoustic filter 10 has a steep passband between 2.375 GHz and 2.625 GHz with a center frequency at 2.5 GHz. The passband (2.375~2.625 GHz) loss of the acoustic filter 10 is about 0.3 dB. For adjacent stopband ranges (2.325~2.375 GHz and 2.625~2.675 GHz), the signal depression is at least 10 dB. Herein, the adjacent stopband ranges are relatively narrow, which may be improved by cascading several acoustic filters 10 described above.

In order to further increase power handling, the first power bypass path 16 may include multiple transmission lines. As shown in FIG. 11, the first power bypass path 16 includes the first transmission line 62, a second transmission line 64, and a third transmission line 66 coupled to form a Pi-type (shunt, series, shunt) structure. The first transmission line 62 is coupled between the first node 12 and the second node 14, and in parallel with the first AR path 18. The second transmission line 64 is coupled between a first side of the first transmission line 62 and ground, and the third transmission line 66 is coupled between a second side of the first transmission line 62 and ground. In some applications, the second transmission line 62 and the third transmission line 66 are floating, and only coupled to the first transmission line 62. Further, in some applications, the first power bypass path 16 may include multiple transmission lines coupled to form a T-type (series, shunt, series) structure.

FIG. 12 provides a frequency response of the acoustic filter 10 shown in FIG. 11. The acoustic filter 10 has a steep passband between 2.375 GHz and 2.625 GHz with a center frequency at 2.5 GHz. The passband (2.375~2.625 GHz) loss of the acoustic filter 10 is less than 0.3 dB. For adjacent stopband ranges (1.75~2.375 GHz and 2.625~2.7 GHz), the signal depression is at least 15 dB. Herein, the adjacent stopband ranges are relatively narrow, which may be improved by cascading several acoustic filters 10 described above.

FIG. 13 provides an alternative acoustic filter 10A with a cascade structure to further improve the signal depression in adjacent stopband ranges. Besides the first filter cell 20, the acoustic filter 10A further includes a third node 68, a fourth node 70, a second power bypass path 72, and a second AR path 74. The second power bypass path 72 extends between the third node 68 and the fourth node 70. The second AR path 74 is in parallel with the second power bypass path 72, and also extends between the third node 68 and the fourth node 70. The third node 68 is coupled to the second node 14 and the first power bypass path 16 is in series with the second power bypass path 72. The second power bypass path 72 and the second AR path 74 form a second filter cell 76, which is cascaded with the first filter cell 20. In some applications, there are more than two filter cells cascaded. The input signal IN applied to the first node 12 provides an output signal OUT at the fourth node 70. The second power bypass path 72 is a high power handling path with a loss no more than 1 dB, and the second AR path 74 has a high Q factor no less than 500. The second power bypass path 72 may be a transmission line path including at least one transmission line or an L-C path that may have a low-pass filter response, a high-pass filter response, or a band-pass filter response. The second power bypass path 72 may have a low-pass filter response, a high-pass filter response, or a band-pass filter response. The second AR path 74 has a notch filter response. The second filter cell 76 has a band-pass filter response.

In this embodiment, the second power bypass path 72 is an L-C path including a fifth series capacitor 78, a sixth series capacitor 80, and a second shunt inductor 82 coupled to form the T-type CLC structure. Herein, both the first power bypass path 16 and the second power bypass path 72 have high-pass filter responses. The fifth series capacitor 78 is in series with the sixth series capacitor 80. The fifth series capacitor 78 and the sixth series capacitor 80 are coupled between the third node 68 and the fourth node 70. The second shunt inductor 82 is coupled between ground and a joint node of the fifth series capacitor 78 and the sixth series capacitor 80.

Similar to the first AR path 18, the second AR path 74 includes three second series resonators 84 and two second shunt resonators 86 coupled to form a ladder network. The second series resonators 84 are in series and coupled between the third node 68 and the fourth node 70. Each second shunt resonator 86 is coupled between ground and a joint node of adjacent two second series resonators 84, respectively. Further, the second AR path 74 may include two second anti-resonant inductors 88. Each second anti-resonant inductor 88 is coupled between ground and a corresponding second shunt resonator 86.

FIG. 14 provides a frequency response of the acoustic filter 10A shown in FIG. 11. The acoustic filter 10A has a steep passband between 2.375 GHz and 2.625 GHz with a center frequency at 2.5 GHz. With the cascade structure, the passband (2.375~2.625 GHz) loss of the acoustic filter 10A is about 0.5 dB, while the signal depression in adjacent stopband ranges (<2.375 GHz and 2.625~3.125 GHz) is at least 45 dB. The signal depression for frequencies higher than 3.125 GHz may be improved by cascading the acoustic filter 10A with a low-pass filter, which does not have a steepness requirement.

For the cascade structure, the acoustic filter 10A may further include a filtering match circuit between the first filter cell 20 and the second filter cell 76 to improve the overall filter response. The filtering match circuit may be a band-pass match circuit, a high-pass match circuit, or a low-pass match circuit. As shown in FIG. 15, the acoustic filter 10A further includes a fifth shunt capacitor 90 and a third shunt inductor 92 coupled to form the filtering match circuit. The fifth shunt capacitor 90 is coupled between the second node 14 and ground and the third shunt inductor 92 is coupled between the second node 14 and ground.

FIG. 16 provides a frequency response of the acoustic filter 10A shown in FIG. 15. The acoustic filter 10A has a steep passband between 2.375 GHz and 2.625 GHz with a center frequency at 2.5 GHz. The passband (2.375~2.625 GHz) loss of the acoustic filter 10A is about 0.5 dB. The signal depression in adjacent stopband ranges (2~2.375 GHz and 2.625~3.125 GHz) is at least 45 dB. The introduction of the fifth shunt capacitor 90 and the third shunt inductor 92 leads the signal depression for frequencies higher than 3.125 GHz and lower than 2 GHz to at least 12 dB. The signal depression for frequencies higher than 3.125 GHz and lower than 2 GHz may be improved by cascading the acoustic filter 10A with a band-pass filter, which does not have a steepness requirement.

For different applications, the first AR path 18 and the second AR path 74 may include fewer or more acoustic resonators. As shown in FIG. 17, the first AR path 18 only includes two first series resonators 28 and one first shunt resonator 30, and the second AR path 74 only includes two second series resonators 84 and one second shunt resonator 86. The first AR path 18 and the second AR path 74 may include different numbers of acoustic resonators.

FIG. 18 provides a frequency response of the acoustic filter 10A shown in FIG. 17. The acoustic filter 10A has a steep passband between 2.375 GHz and 2.625 GHz with a center frequency at 2.5 GHz. The passband (2.375~2.625 GHz) loss of the acoustic filter 10A is about 0.5 dB. The signal depression in adjacent stopband ranges (<2.375 GHz and 2.625~2.8 GHz) is at least 30 dB. Notice that fewer acoustic resonators in the AR paths may shrink the adjacent stopband range above the passband. The signal depression for frequencies higher than 2.8 GHz may be improved by cascading the acoustic filter 10A with a low-pass filter, which does not have a steepness requirement.

In one embodiment, both the first power bypass path 16 and the second power bypass path 72 are L-C paths having low-pass filter responses. As shown in FIG. 19, the first power bypass path 16 includes the first series inductor 34, the second series inductor 36, and the first shunt capacitor 38 coupled to form the T-type LCL structure that has a low-pass filter response. The second power bypass path 72 includes a third series inductor 94, a fourth series inductor 96, and a sixth shunt capacitor 98 coupled to form another T-type LCL structure that has a low-pass filter response. The third series inductor 94 is in series with the fourth series inductor 96.

The third series inductor 94 and the fourth series inductor 96 are coupled between the third node 68 and the fourth node 70. The sixth shunt capacitor 98 is coupled between ground and a joint node of the third series inductor 94 and the fourth series inductor 96. Herein, both the first filter cell 20 and the second filter cell 76 still have band-pass filter responses over the range of interest.

FIG. 20 provides a frequency response of the acoustic filter 10A shown in FIG. 18. The acoustic filter 10A has a steep passband between 2.375 GHz and 2.625 GHz with a center frequency at 2.5 GHz. The passband (2.375~2.625 GHz) loss of the acoustic filter 10A is about 0.5 dB. For adjacent stopband ranges (1.9~2.375 GHz and >2.625 GHz), the signal depression is at least 20 dB. The signal depression for frequencies lower than 1.9 GHz may be improved by cascading the acoustic filter 10A with a high-pass filter, which does not have a steepness requirement.

It is clear to anyone skilled in the art that the first power bypass path 16 and the second power bypass path 72 may have different filter responses. Further, in some applications, the first power bypass path 16 is an L-C path having a filter response, while the second power bypass path 72 is a transmission line path with no filter response. As shown in FIG. 21, the first power bypass path 16 includes the first series capacitor 22, the second series capacitor 24, and the first shunt inductor 26 coupled to form the T-type CLC structure that has a high-pass filter response. The second power bypass path 72 includes the third series inductor 94, the fourth series inductor 96, and the sixth shunt capacitor 98 coupled to form another T-type LCL structure that has a low-pass filter response. Herein, both the first filter cell 20 and the second filter cell 76 still have band-pass filter responses over the range of interest.

FIG. 22 provides a frequency response of the acoustic filter 10A shown in FIG. 21. The acoustic filter 10A has a steep passband between 2.375 GHz and 2.625 GHz with a center frequency at 2.5 GHz. The passband (2.375~2.625 GHz) loss of the acoustic filter 10A is about 0.5 dB. For adjacent stopband ranges (<2.375 GHz and 2.625~3.375 GHz), the signal depression is at least 20 dB. The signal depression for frequencies higher than 3.375 GHz may be improved by cascading the acoustic filter 10A with a low-pass filter, which does not have a steepness requirement.

With the cascade structure, the acoustic filter 10A may perform as a duplexer, triplexer, diplexer or multiplexer. As shown in FIG. 23, the acoustic filter 10A includes four cascaded filter cells, the first filter cell 20, the second filter cell 76, a third filter cell 100, and a fourth filter cell 102. The third filter cell 100 includes a fifth node 104, a sixth node 106, a third power bypass path 108, and a third AR path 110. The third power bypass path 108 extends between the fifth node 104 and the sixth node 106. The third AR path 110 is in parallel with the third power bypass path 108 and also extends between the fifth node 104 and the sixth node 106. The fifth node 104 is coupled to the fourth node 70, and the third power bypass path 108 is in series with the second power bypass path 72. The third power bypass path 108 is a high power handling path with a loss no more than 1 dB, and the third AR path 110 has a high Q factor no less than 500.

In this embodiment, the third power bypass path 108 is an L-C path including a seventh series capacitor 112, an eighth series capacitor 114, and a fourth shunt inductor 116 coupled to form the T-type CLC structure that has a high-pass filter response. The seventh series capacitor 112 is in series with the eighth series capacitor 114. The seventh series capacitor 112 and the eighth series capacitor 114 are coupled between the fifth node 104 and the sixth node 106. The fourth shunt inductor 116 is coupled between ground and a joint node of the seventh series capacitor 112 and the eighth series capacitor 114. The third AR path 110 includes two third series resonators 118 and one third shunt resonator 120. The third series resonators 118 are in series and coupled between the fifth node 104 and the sixth node 106. The third shunt resonator 120 is coupled between ground and a joint node of adjacent third series resonators 118. Further, the third AR path 110 may include a third anti-resonant inductor 122. The third anti-resonant inductor 122 is coupled between ground and the third shunt resonator 120.

Similarly, the fourth filter cell 102 is an L-C path including a seventh node 124, an eighth node 126, a fourth power bypass path 128, and a fourth AR path 130. The fourth power bypass path 128 extends between the seventh node 124 and the eighth node 126. The fourth AR path 130 is in parallel with the fourth power bypass path 128 and also extends between the seventh node 124 and the eighth node 126. The seventh node 124 is coupled to the sixth node 106, and the fourth power bypass path 128 is in series with the third power bypass path 108. The fourth power bypass path 128 is a high power handling path with a loss no more than 1 dB, and the fourth AR path 130 has a high Q factor no less than 500.

In this embodiment, the fourth power bypass path 128 includes a ninth series capacitor 132, a tenth series capacitor 134, and a fifth shunt inductor 136 coupled to form the T-type CLC structure that has a high-pass filter response. The ninth series capacitor 132 is in series with the tenth series capacitor 134. The ninth series capacitor 132 and the tenth series capacitor 134 are coupled between the seventh node 124 and the eighth node 126. The fifth shunt inductor 136 is coupled between ground and a joint node of the ninth series capacitor 132 and the tenth series capacitor 134. The fourth AR path 130 includes two fourth series resonators 138 and one fourth shunt resonator 140. The fourth series resonators 138 are in series and coupled between the seventh node 124 and the eighth node 126. The fourth shunt resonator 140 is coupled between ground and a joint node of adjacent fourth series resonators 138. Further, the fourth AR path 130 may include a fourth anti-resonant inductor 142. The fourth anti-resonant inductor 142 is coupled between ground and the fourth shunt resonator 140.

Herein, the input signal IN may be applied to the fourth node 70 (fifth node 104), which may provide a first output signal OUT1 at the first node 12 and a second output signal OUT2 at the eighth node 126. As such, the acoustic filter 10A may perform as a duplexer with different filtering responses. For different applications, each power bypass path (16/72/108/128) may have a low-pass filter response, a high-pass filter response, or a band-pass filter response. Each AR path (18/74/110/130) has a notch filter response. Each filter cell (20/76/100/102) has a band-pass filter response over the range of interest. In addition, the first AR path 18, the second AR path 74, the third AR path 110, and the fourth AR path 130 may include different numbers of series/shunt resonators and may not be identical in terms of frequency or static capacitance.

FIG. 24 provides two frequency responses of the acoustic filter 10A shown in FIG. 23. The dashed line shows a first frequency response from the fourth node 70 through the second and first filter cells 76 and 20 to the first node 12. The first frequency response has a steep passband between 2.45 GHz and 2.7 GHz with a center frequency at 2.57 GHz. The passband (2.45~2.7 GHz) loss within the first frequency response is about 1 dB, while the signal depression in adjacent stopband ranges (<2.45 GHz and 2.7~2.8 GHz) is at least 40 dB. The solid line shows a second frequency response from the fourth node 70 through the third and fourth filter cells 100 and 102 to the eighth node 126. The second frequency response has a steep passband between 2.3 GHz and 2.55 GHz with a center frequency at 2.42 GHz. The passband (2.3~2.55 GHz) loss within the second frequency response is about 0.5 dB, while the signal depression in adjacent stopband ranges (<2.3 GHz and 2.55~2.65 GHz) is at least 40 dB.

In order to widen the stopband range adjacent to the passband, there may be multiple AR paths in parallel with a same power bypass path. FIG. 25 provides an acoustic filter 10B including the first power bypass path 16, the first AR path 18, and a fifth AR path 144, where both the first AR path 18 and the fifth AR path 144 are in parallel with the first power bypass path 16. The first power bypass path 16 may be a transmission line path including at least one transmission line or an L-C path that may have a low-pass filter response, a high-pass filter response, or a band-pass filter response. The first AR path 18 and the fifth AR path 144 may be symmetrical or asymmetrical. By definition, AR paths are asymmetrical if they include different numbers of resonators, different types of resonators, or different resonator configurations.

For the purpose of this illustration, the first power bypass path 16 is an L-C path including the first series capacitor 22, the second series capacitor 24, and the first shunt inductor 26 coupled to form the T-type CLC structure that has a high-pass filter response. The first AR path 18 includes two first series resonators 28, one first shunt resonator 30, and one first anti-resonant inductor 32. The fifth AR path 144 includes two fifth series resonators 146 and one fifth shunt resonator 148. The fifth series resonators 146 are in series and coupled between the first node 12 and the second node 14. The fifth shunt resonator 148 is coupled between ground and a joint node of adjacent two fifth series resonators 146. The fifth AR path 144 may further include a fifth anti-resonant inductor 150. The fifth anti-resonant inductor 150 is coupled between ground and the fifth shunt resonator 148.

FIG. 26 provides a frequency response of the acoustic filter 10B shown in FIG. 25. In this embodiment, the acoustic filter 10B has a steep passband between 2.375 GHz and 2.625 GHz with a center frequency at 2.5 GHz. Herein, the passband (2.375~2.625 GHz) loss of the acoustic filter 10 is about 0.5 dB. For adjacent stopband ranges (<2.375 GHz and 2.625~3.2 GHz), a signal depression is at least 15 dB. The signal depression for frequencies higher than 3.2 GHz may be improved by cascading the acoustic filter 10B with a low-pass filter, which does not have a steepness requirement.

Clearly, the first AR path 18 and the fifth AR path 144 may also be in parallel with the first power bypass path 16 that has a low-pass filter response, band-pass filter response, or no filter response. As shown in FIG. 27, the first power bypass path 16 is an L-C path including the first series inductor 34, the second series inductor 36, and the first shunt capacitor 38 coupled to form the T-type LCL structure that has a low-pass filter response. The first AR path 18 includes two first series resonators 28, one first shunt resonator 30, and one first anti-resonant inductor 32. The fifth AR path 144 includes two fifth series resonators 146, one fifth shunt resonator 148, and one fifth anti-resonant inductor 150.

FIG. 28 provides a frequency response of the acoustic filter 10B shown in FIG. 27. In this embodiment, the acoustic filter 10B has a steep passband between 2.375 GHz and 2.625 GHz with a center frequency at 2.5 GHz. Herein, the passband (2.375~2.625 GHz) loss of the acoustic filter 10 is about 0.5 dB. For adjacent stopband ranges (1.9~2.375 GHz and 2.625~3.25 GHz), a signal depression is at least 20 dB. The signal depression for frequencies higher than 3.25 GHz and lower than 1.9 GHz may be improved by cascading the acoustic filter 10B with a band-pass filter, which does not have a steepness requirement.

FIG. 29 provides an acoustic filter 10C with a nested structure that may increase power handling. Besides the first filter cell 20 and the second filter cell 76, the acoustic filter 10C further includes a fifth power bypass path 152 coupled between the first node 12 and the fourth node 70 and in parallel with the first power bypass path 16 and the second power bypass path 72. The fifth power bypass path 152 may be a transmission line path including at least one transmission line or an L-C path that may have a low-pass filter response, a high-pass filter response, or a band-pass filter response. For the purpose of this illustration, the first power bypass path 16 is an L-C path including the first series capacitor 22, the second series capacitor 24, and the first shunt inductor 26 coupled to form the T-type CLC structure that has a high-pass filter response. The second power bypass path 72 is an L-C path including the fifth series capacitor 78, the sixth series capacitor 80, and the second shunt inductor 82 coupled to form the T-type CLC structure that has a high-pass filter response. The fifth power bypass path 152 is an L-C path including an eleventh series capacitor 154, a twelfth series capacitor 156, and a sixth shunt inductor 158 coupled to form the T-type CLC structure that has a high-pass filter response. The eleventh series capacitor 154 is in series with the twelfth series capacitor 156. The eleventh series capacitor 154 and the twelfth series capacitor 156 are coupled between the first node 12 and the fourth node 70. The sixth shunt inductor 158 is coupled between ground and a joint node of the eleventh series capacitor 154 and the twelfth series capacitor 156. For different applications, each power bypass path (16/72/152) may have a low-pass filter response, a high-pass filter response, a band-pass filter response, or no filter response.

FIG. 30 provides a frequency response of the acoustic filter 10C shown in FIG. 29. In this embodiment, the acoustic filter 10C has a steep passband between 2.45 GHz and 2.55 GHz with a center frequency at 2.5 GHz. Herein, the passband (2.45~2.55 GHz) loss of the acoustic filter 10 is less than 0.5 dB. For adjacent stopband ranges (2.3~2.45 GHz and 2.55~3 GHz), a signal depression is at least 15 dB. Herein, the adjacent stopband ranges are relatively narrow, which may be improved by cascading the acoustic filter 10C with other acoustic filters (10/10A/10B/10C) described above.

Those skilled in the art will recognize improvements and modifications to the preferred embodiments of the present disclosure. All such improvements and modifications are considered within the scope of the concepts disclosed herein and the claims that follow.

What is claimed is:

1. An acoustic filter comprising:
   a first node and a second node;
   a first power bypass path that extends between the first node and the second node, wherein the first power bypass path is an inductor-capacitor (L-C) path that has a low-pass filter response or a high-pass filter response; and
   a first acoustic resonator (AR) path that extends between the first node and the second node, and is in parallel with the first power bypass path, wherein:

the first AR path comprises two series resonators and a shunt resonator, wherein the two series resonators are coupled in series between the first node and the second node, and the shunt resonator is coupled between ground and a common node of the two series resonators;

the first AR path has a notch filter response; and the first power bypass path and the first AR path form a first filter cell that has a band-pass filter response.

2. An acoustic filter comprising:

a first node and a second node;

at least one transmission line that extends between the first node and the second node; and a first acoustic resonator (AR) path that extends between the first node and the second node, is in parallel with the at least one transmission line, and comprises at least one acoustic resonator that forms an acoustic resonator network wherein:

the first AR path has a notch filter response; and the at least one transmission line and the first AR path form a first filter cell that has a band-pass filter response.

3. The acoustic filter of claim 2 wherein the at least one transmission line has a loss no more than 1 dB and the first AR path has a Q factor no less than 500.

4. The acoustic filter of claim 1 wherein the L-C path comprises series and shunt lumped elements.

5. The acoustic filter of claim 4 wherein the first power bypass path has a loss no more than 1 dB and the first AR path has a Q factor no less than 500.

6. The acoustic filter of claim 5 wherein:

the first AR path has a Q factor greater than 10000;

the first power bypass path has a loss between 0.1 dB and 0.25 dB; and the first filter cell formed by the first power bypass path and the first AR path has a passband with a center frequency between 1 MHz and 300 MHz.

7. The acoustic filter of claim 5 wherein:

the first AR path has a Q factor between 1000 and 3000;

the first power bypass path has a loss between 0.15 dB and 0.5 dB; and the first filter cell formed by the first power bypass path and the first AR path has a passband with a center frequency between 200 MHz and 3 GHz.

8. The acoustic filter of claim 7 wherein each of the two series resonators and the shunt resonator is a bulk acoustic wave (BAW) resonator or a surface acoustic wave (SAW) resonator.

9. The acoustic filter of claim 5 wherein each of the two series resonators and the shunt resonator is one of a group consisting of BAW resonators, SAW resonators, quartz crystal resonators, langatate crystal resonators, microelectromechanical system (MEMs) resonators, thin-film bulk acoustic resonators (FBARs), Microresonators and wine glass mode resonators.

10. The acoustic filter of claim 6 wherein each of the two series resonators and the shunt resonator is a quartz crystal resonator.

11. An acoustic filter comprising:

a first node and a second node;

a first power bypass path that extends between the first node and the second node;

a first acoustic resonator (AR) path that extends between the first node and the second node, is in parallel with the first power bypass path, and comprises at least one first acoustic resonator that forms a first AR network, wherein:

the first AR path has a notch filter response; and the first power bypass path and the first AR path form a first filter cell that has a band-pass filter response;

a third node and a fourth node;

a second power bypass path that extends between the third node and the fourth node; and a second AR path that extends between the third node and the fourth node, is in parallel with the second power bypass path, and comprises at least one second acoustic resonator that forms a second acoustic resonator network, wherein:

the third node is coupled to the second node and the first power bypass path is in series with the second power bypass path;

the second AR path has a notch filter response;

the second power bypass path and the second AR path form a second filter cell that has a band-pass filter response; and the second filter cell is cascaded with the first filter cell.

12. An acoustic filter comprising:

a first node and a second node;

a first power bypass path that extends between the first node and the second node;

a first acoustic resonator (AR) path that extends between the first node and the second node, is in parallel with the first power bypass path, and comprises at least one first acoustic resonator that forms a first AR network, wherein:

the first AR path has a notch filter response; and the first power bypass path and the first AR path form a first filter cell that has a band-pass filter response;

a third node and a fourth node;

a second power bypass path that extends between the third node and the fourth node; and a second AR path that extends between the third node and the fourth node, is in parallel with the second power bypass path, and comprises at least one second acoustic resonator that forms a second acoustic resonator network, wherein:

the third node is coupled to the second node;

the second AR path has a notch filter response;

the second power bypass path and the second AR path form a second filter cell that has a band-pass filter response; and an input signal applied to the second node provides a first output signal at the first node and a second output signal at the fourth node.

13. The acoustic filter of claim 11 wherein:

the first power bypass path has a loss no more than 1 dB;

the second power bypass path has a loss no more than 1 dB;

the first AR path has a Q factor no less than 500; and the second AR path has a Q factor no less than 500.

14. The acoustic filter of claim 13 wherein:

the first power bypass path is a first L-C path that has a first filter response and comprises first series and shunt lumped elements; and the second power bypass path is a second L-C path that has a second filter response and comprises second series and shunt lumped elements.

15. The acoustic filter of claim 14 wherein:

the first power bypass path has one of a low-pass filter response, a high-pass filter response, and a band-pass filter response; and the second power bypass path has one of a low-pass filter response, a high-pass filter response, and a band-pass filter response.

16. The acoustic filter of claim 13 wherein:
the first power bypass path is an L-C path that has a filter response and comprises series and shunt lumped elements; and
the second power bypass path is a transmission line path including at least one transmission line.

17. The acoustic filter of claim 13 further includes a filtering match circuit between the first filter cell and the second filter cell to improve overall filter response.

18. The acoustic filter of claim 13 further includes a third power bypass path, wherein:
the third power bypass path extends between the first node and the fourth node, and is in parallel with the first power bypass path and the second power bypass path; and
the third power bypass path has a loss no more than 1 dB.

19. An acoustic filter comprising:
a first node and a second node;
a first power bypass path that extends directly between the first node and the second node;
a first acoustic resonator (AR) path that extends directly between the first node and the second node, is in parallel with the first power bypass path, and comprises at least one first acoustic resonator that forms a first AR network, wherein:
the first AR path has a notch filter response; and
the first power bypass path and the first AR path form a first filter cell that has a band-pass filter response;
a second AR path that has a notch filter response, wherein the second AR path extends directly between the first node and the second node, and is in parallel with the first power bypass path.

20. The acoustic filter of claim 19 wherein:
the first power bypass path has a loss no more than 1 dB;
the first AR path has a Q factor no less than 500; and
the second AR path has a Q factor no less than 500.

21. The acoustic filter of claim 20 wherein the first AR path and the second AR path are asymmetrical.

22. The acoustic filter of claim 20 wherein the first power bypass path is an L-C path that has a filter response and comprises series and shunt lumped elements.

23. The acoustic filter of claim 20 wherein the first power bypass path is a transmission line path that has no filter response and comprises at least one transmission line.

24. The acoustic filter of claim 20 wherein the first AR path and the second AR path are symmetrical.

* * * * *

UNITED STATES PATENT AND TRADEMARK OFFICE
CERTIFICATE OF CORRECTION

PATENT NO. : 10,277,198 B2
APPLICATION NO. : 15/437744
DATED : April 30, 2019
INVENTOR(S) : Kelly M. Lear It is certified that error appears in the above-identified patent and that said Letters Patent is hereby corrected as shown below:

In the Specification

In Column 6, Line 34, replace "(2.37~2.625 GHz)" with -- (2.375~2.625 GHz) --.

In Column 6, Line 37, replace "2.62~3.125 GHz" with -- 2.625~3.125 GHz --.

In Column 7, Lines 12 and 38, replace "(2.37~2.625 GHz)" with -- (2.375~2.625 GHz) --.

In Column 7, Line 40, replace "2.62~3 GHz" with -- 2.625~3 GHz --.

Signed and Sealed this
Eleventh Day of June, 2019

Andrei Iancu
*Director of the United States Patent and Trademark Office*